United States Patent
Li et al.

(10) Patent No.: US 9,508,757 B2
(45) Date of Patent: Nov. 29, 2016

(54) ARRAY SUBSTRATE AND MANUFACTURING METHOD THEREOF, DISPLAY PANEL AND DISPLAY APPARATUS

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Yue Li, Beijing (CN); Xue Dong, Beijing (CN); Hailin Xue, Beijing (CN); Xiaochuan Chen, Beijing (CN)

(73) Assignees: BOE TECHNOLOGY GROUP CO., LTD., Beijing (CN); BEIJING BOE OPTOELECTRONICS TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/389,115

(22) PCT Filed: Dec. 2, 2013

(86) PCT No.: PCT/CN2013/088312
§ 371 (c)(1),
(2) Date: Sep. 29, 2014

(87) PCT Pub. No.: WO2015/021708
PCT Pub. Date: Feb. 19, 2015

(65) Prior Publication Data
US 2015/0294996 A1    Oct. 15, 2015

(30) Foreign Application Priority Data
Aug. 16, 2013    (CN) .......................... 2013 1 0359419

(51) Int. Cl.
*H01L 29/04* (2006.01)
*H01L 27/14* (2006.01)
(Continued)

(52) U.S. Cl.
CPC ..... *H01L 27/1251* (2013.01); *H01L 21/02532* (2013.01); *H01L 21/02592* (2013.01);
(Continued)

(58) Field of Classification Search
CPC ..... H01L 21/02; H01L 27/12; H01L 21/336; H01L 27/01; H01L 27/3244; H01L 27/1229; H01L 27/127; H01L 27/1251; H01L 27/12532; H01L 21/02592; H01L 21/02675; H01L 27/1218; H01L 27/1222; H01L 29/66757; H01L 29/66765; H01L 29/78669; H01L 29/78675
USPC ....... 257/59, 72, 359, E21.413, E27.111, 79, 257/99, 71, E29.003; 438/158, 239, 149, 438/200, 30
See application file for complete search history.

(56) References Cited

U.S. PATENT DOCUMENTS

2003/0124755 A1*  7/2003  Yamanaka .............. C30B 13/00
                                                                                 438/30
2004/0105067 A1*  6/2004  Kim .................... G02F 1/13458
                                                                                 349/187

(Continued)

FOREIGN PATENT DOCUMENTS

CN    1429382 A    7/2003
CN    1441501 A    9/2003

(Continued)

OTHER PUBLICATIONS

Search Report issued in International Application No. PCT/CN2013/088312, fourteen (14) pages.

(Continued)

*Primary Examiner* — Dzung Tran
(74) *Attorney, Agent, or Firm* — Nath, Goldberg & Meyer; Joshua B. Goldberg

(57) ABSTRACT

The present invention provides an array substrate and a manufacturing method thereof, a display panel and a display apparatus. The array substrate comprises: a base substrate; and a pixel region and a periphery region formed on the base substrate, wherein the periphery region is located around the pixel region, the pixel region comprises an amorphous silicon thin film transistor, and the periphery region comprises a low temperature poly-silicon structure. As the a-Si thin film transistor is used in the pixel region of the array substrate, the problem that there is a too large leakage current in the pixel region of the LTPS array substrate in the prior art is overcome, the leakage current in the pixel region is reduced, while as the LTPS structure is used in the periphery region of the array substrate, a narrow frame of the display panel and the display apparatus may be achieved.

12 Claims, 6 Drawing Sheets

(51) Int. Cl.
- *H01L 33/00* (2010.01)
- *H01L 23/62* (2006.01)
- *H01L 27/12* (2006.01)
- *H01L 21/02* (2006.01)
- *H01L 29/66* (2006.01)
- *H01L 29/786* (2006.01)

(52) U.S. Cl.
CPC ....... *H01L21/02675* (2013.01); *H01L 27/127* (2013.01); *H01L 27/1218* (2013.01); *H01L 27/1222* (2013.01); *H01L 27/1229* (2013.01); *H01L 27/1259* (2013.01); *H01L 29/66757* (2013.01); *H01L 29/66765* (2013.01); *H01L 29/78669* (2013.01); *H01L 29/78675* (2013.01)

(56) References Cited

U.S. PATENT DOCUMENTS

| | | | |
|---|---|---|---|
| 2005/0176194 A1* | 8/2005 | Sasaki | H01L 21/8221 438/197 |
| 2006/0141685 A1 | 6/2006 | Kim et al. | |
| 2008/0073564 A1* | 3/2008 | Mun | H01J 37/20 250/441.11 |
| 2008/0093602 A1* | 4/2008 | Matsumura | G09G 3/3233 257/71 |
| 2011/0049523 A1* | 3/2011 | Choi | H01L 27/1225 257/72 |

FOREIGN PATENT DOCUMENTS

| | | |
|---|---|---|
| CN | 101165907 A | 4/2008 |
| CN | 101355090 A | 1/2009 |
| CN | 101414638 A | 4/2009 |
| CN | 203386754 U | 1/2014 |

OTHER PUBLICATIONS

First Office Action, and its english translation, of the CN application 201310359419.1, issued May 18, 2015.

English translation of the written opinion of the international searching authority—i.e., form PCT/ISA/237 of PCT/CN2013/088312—mailed Jun. 10, 2014.

\* cited by examiner

ARRAY SUBSTRATE AND MANUFACTURING METHOD THEREOF, DISPLAY PANEL AND DISPLAY APPARATUS This is a National Phase Application filed under 35 U.S.C. 371 as a national stage of PCT/CN2013/088312, filed Dec. 2, 2013, and claims priority benefit from Chinese Application No. 201310359419.1, filed Aug. 16, 2013, the content of each of which is hereby incorporated by reference in its entirety.

TECHNICAL FIELD

The present invention relates to the field of display technology, and particularly, to an array substrate and manufacturing method thereof, a display panel and a display apparatus.

BACKGROUND ART

In the field of display technology, amorphous silicon (a-Si) technology and low temperature poly-silicon (LTPS) technology are relatively widely used. With development of display technology, LTPS technology is more and more widely used because it can lead to characteristics of high efficiency and high definition.

In the prior art, when an array substrate is manufactured by using LTPS technology, there may be a relatively large leakage current in the pixel region of the array substrate. When an array substrate is manufactured by using a-Si technology, due to pattern structures of the periphery region of the array substrate, it may be difficult to design a narrow frame for a display panel and a display apparatus comprising the array substrate.

As above, in the prior art, there is still no technical solution for reducing the leakage current of the pixel region while making the display panel and the display apparatus have a narrow frame.

SUMMARY

An objective of the present invention is to provide an array substrate and a manufacturing method thereof, a display panel and a display apparatus for reducing the leakage current of the pixel region and designing a narrow frame for the display panel and the display apparatus.

In order to achieve above objective, the present invention provides an array substrate comprising: a base substrate; and a pixel region and a periphery region formed on the base substrate, wherein the periphery region is located around the pixel region, the pixel region comprises an amorphous silicon thin film transistor, and the periphery region comprises a low temperature poly-silicon structure.

The amorphous silicon thin film transistor may be a bottom-gate-type amorphous silicon thin film transistor.

The low temperature poly-silicon structure may comprise a low temperature poly-silicon thin film transistor.

The low temperature poly-silicon thin film transistor may be a top-gate-type low temperature poly-silicon thin film transistor.

The array substrate may further comprise: a buffer layer, which is formed on the base substrate and below the amorphous silicon thin film transistor and the low temperature poly-silicon structure, and covers the whole base substrate.

The amorphous silicon thin film transistor may comprise an amorphous silicon active layer pattern, the low temperature poly-silicon thin film transistor may comprise a low temperature poly-silicon active layer pattern, and the amorphous silicon active layer pattern and the low temperature poly-silicon active layer pattern are formed in the same layer.

In order to achieve above objective, the present invention also provides a display panel comprising above array substrate.

In order to achieve above objective, the present invention also provides a display apparatus comprising above display panel.

In order to achieve above objective, the present invention also provides a manufacturing method of an array substrate, which comprises steps of: forming a pixel region and a periphery region on a base substrate, wherein the periphery region is located around the pixel region, an amorphous silicon thin film transistor is formed in the pixel region, and a low temperature poly-silicon structure is formed in the periphery region.

The low temperature poly-silicon structure may comprise a low temperature poly-silicon thin film transistor.

A gate, an amorphous silicon active layer pattern, a source and a drain of the amorphous silicon thin film transistor are formed in the pixel region, and a low temperature poly-silicon active layer pattern, a gate, and a source-drain pattern of the low temperature poly-silicon thin film transistor are formed in the periphery region, wherein the amorphous silicon active layer pattern and the low temperature poly-silicon active layer pattern are formed in the same layer.

The manufacturing method may comprise steps of: forming the gate of the amorphous silicon thin film transistor on the base substrate and in the pixel region; forming a gate insulating layer above the gate of the amorphous silicon thin film transistor, the gate insulating layer covers the whole base substrate; above the gate insulating layer, forming the amorphous silicon active layer pattern in the pixel region and forming a low temperature poly-silicon pattern in the periphery region; forming a gate insulating pattern above the low temperature poly-silicon pattern; forming the gate of the low temperature poly-silicon thin film transistor above the gate insulating pattern; doping the low temperature poly-silicon pattern to form the low temperature poly-silicon active layer pattern; forming the source and the drain of the amorphous silicon thin film transistor above the amorphous silicon active layer pattern, and forming the source-drain pattern of the low temperature poly-silicon thin film transistor above the low temperature poly-silicon active layer pattern.

The step of forming the amorphous silicon active layer pattern in the pixel region and forming a low temperature poly-silicon pattern in the periphery region may comprise: forming an amorphous silicon material layer above the gate insulating layer, the amorphous silicon material layer covers the whole base substrate; shielding the pixel region with an anti-UV substrate, and performing a laser crystallization process on the amorphous silicon material layer in the periphery region to form a low temperature poly-silicon material layer in the periphery region; performing a patterning process on the amorphous silicon material layer in the pixel region and the low temperature poly-silicon material layer in the periphery region to form an amorphous silicon pattern in the pixel region and a low temperature poly-silicon pattern in the periphery region; and forming a N+ amorphous silicon pattern above the amorphous silicon pattern in the pixel region to form the amorphous silicon active layer pattern in the pixel region.

The present invention has following advantageous effects.

In the array substrate and manufacturing method thereof, the display panel and the display apparatus of the present invention, as the a-Si thin film transistor is used in the pixel region of the array substrate, the problem that there is a too large leakage current in the pixel region of the LTPS array substrate in the prior art is overcome, the leakage current in the pixel region is reduced, while as the LTPS structure is used in the periphery region of the array substrate, a narrow frame of the display panel and the display apparatus may be achieved.

DETAILED DESCRIPTION OF THE PREFERRED EMBODIMENTS

In order to make skilled persons in the art better understand the technical solutions of the present invention, the present invention will be described in detail below with reference to the drawings and specific embodiments.

Figure 1:
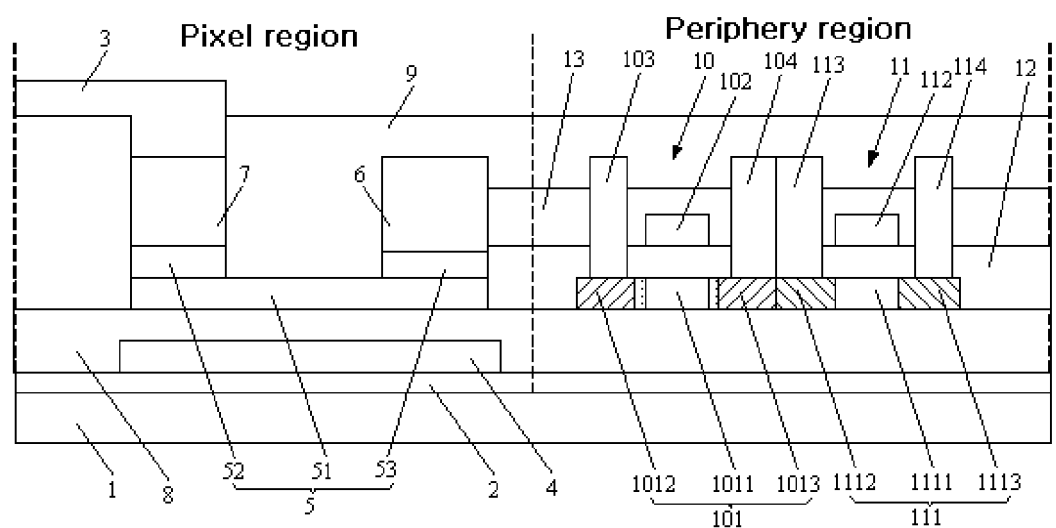
FIG. 1 shows a structural diagram of an array substrate according to a first embodiment of the present invention.

FIG. 1 shows a structural diagram of an array substrate according to a first embodiment of the present invention. As shown in FIG. 1, the array substrate comprises: a base substrate 1; and a pixel region and a periphery region formed on the base substrate 1, wherein the periphery region is located around the pixel region, the pixel region comprises an a-Si thin film transistor, and the periphery region comprises a low temperature poly-silicon (LTPS) structure.

It should be noted that, FIG. 1 only shows parts of the pixel region and the periphery region. For a person skilled in the art, it should be understood that, the present invention is not limited by the pixel region and the periphery region shown in FIG. 1. In addition, the dotted line in FIG. 1 is only used for clearly indicating the pixel region and the periphery region, but it is not a part of the array substrate.

In the present embodiment, the a-Si thin film transistor may be a bottom-gate-type a-Si thin film transistor, and the LTPS structure may comprise a LTPS thin film transistor, wherein the LTPS thin film transistor may be a top-gate-type LTPS thin film transistor.

In actual applications, the a-Si thin film transistor also may be a top-gate-type thin film transistor, and the LTPS thin film transistor also may be a bottom-gate-type thin film transistor.

In the present embodiment, the a-Si thin film transistor comprises an a-Si active layer pattern, and the LTPS thin film transistor comprises a LTPS active layer pattern. The a-Si active layer pattern and the LTPS active layer pattern may be formed in the same layer, that is, they are provided at roughly the same high level.

A buffer layer 2 may be formed on the base substrate 1. The buffer layer 2 is formed on the base substrate 1 and below the a-Si thin film transistor and the LTPS thin film transistor, and covers the whole base substrate 1. The performance of the LTPS thin film transistor may be effectively improved by the buffer layer 2.

Specifically, in the present embodiment, the pixel region comprises pixel units defined by gate lines and data lines, and a pixel unit comprises the a-Si thin film transistor and a pixel electrode 3 connected with the a-Si thin film transistor. In the present embodiment, the a-Si thin film transistor is a bottom-gate-type a-Si thin film transistor. Specifically, the a-Si thin film transistor comprises a gate 4, an a-Si active layer pattern 5, a source 6 and a drain 7. The gate 4 is formed on the buffer layer 2, the a-Si active layer pattern 5 is formed above the gate 4, the source 6 and the drain 7 are formed on the a-Si active layer pattern 5, and the drain 7 is connected with the pixel electrode 3, wherein the a-Si active layer pattern 5 comprises an a-Si pattern 51 and an N+ a-Si pattern 52 and an N+ a-Si pattern 53 formed on the a-Si pattern 51, the source 6 is formed on the N+ a-Si pattern 53, and the drain 7 is formed on the N+ a-Si pattern 52. The N+ a-Si pattern 53 can reduce the contract resistance between the source 6 and the a-Si active layer pattern 5, and N+ a-Si pattern 52 can reduce the contact resistance between the drain 7 and the a-Si active layer pattern 5. The array substrate further comprises a gate insulating layer 8. The gate insulating layer 8 is formed above the gate 4 and below the a-Si active layer pattern 5, and covers the whole base substrate 1, that is, the gate insulating layer 8 spreads all over the pixel region and the periphery region. The gate insulating layer 8 can be used for protecting the gate 4 in the pixel region and improving the performance of the LTPS thin film transistor. The array substrate may further comprise a passivation layer 9. The passivation layer 9 is formed above the source 6 and the drain 7, and covers the whole base substrate 1, that is, the passivation layer 9 spreads all over the pixel region and the periphery region. The passivation layer 9 above the drain 7 is provided with a through-hole, the pixel electrode 3 is filled in the through-hole so that the pixel electrode 3 is connected with the drain 7.

Specifically, in the present embodiment, the periphery region comprises a LTPS thin film transistor 10 and a LTPS thin film transistor 11.

The LTPS thin film transistor 10 comprises a LTPS active layer pattern 101, a gate 102, a source-drain pattern 103 and a source-drain pattern 104. The LTPS active layer pattern 101 is formed on the gate insulating layer 8, and the source-drain pattern 103 and the source-drain pattern 104 are formed on the LTPS active layer pattern 101, the gate 102 is formed above the LTPS active layer pattern 101 and between the source-drain pattern 103 and the source-drain pattern 104. The LTPS active layer pattern 101 comprises a LTPS sub-pattern 1011, an n-type doped pattern 1012 and an n-type doped pattern 1013 formed at two sides of the LTPS sub-pattern 1011 respectively.

The LTPS thin film transistor 11 comprises a LTPS active layer pattern 111, a gate 112, a source-drain pattern 113 and a source-drain pattern 114. The LTPS active layer pattern 111 is formed on the gate insulating layer 8, the source-drain pattern 113 and the source-drain pattern 114 are formed on the LTPS active layer pattern 111, and the gate 112 is formed above the LTPS active layer pattern 111 and between the source-drain pattern 113 and the source-drain pattern 114. The LTPS active layer pattern 111 comprises a LTPS sub-pattern 1111, and a p-type doped pattern 1112 and a p-type doped pattern 1113 formed at two sides of the LTPS sub-pattern 1111 respectively.

The array substrate further comprises a gate insulating pattern 12. The gate insulating pattern 12 is formed above the LTPS active layer pattern 101 and the LTPS active layer pattern 111 and below the gate 102 and the gate 112. The array substrate further comprises an inter-layer dielectric (ILD) pattern 13. The ILD pattern 13 is formed above the gate 102 and the gate 112. The gate insulating pattern 12 and the ILD pattern 13 are provided with a plurality of through-holes, the source-drain pattern 103 is filled in a through-hole to achieve the connection of the source-drain pattern 103 and the n-type doped pattern 1012, the source-drain pattern 104 is filled in a through-hole to achieve the connection of the source-drain pattern 104 and the n-type doped pattern 1013, the source-drain pattern 113 is filled in a through-hole to achieve the connection of the source-drain pattern 113 and the p-type doped pattern 1112, and the source-drain pattern 114 is filled in a through-hole to achieve the connection of the source-drain pattern 114 and the p-type doped pattern 1113. In the present embodiment, the LTPS active layer pattern 101 and the LTPS active layer pattern 111 are formed integrally. In actual applications, the source-drain pattern 104 and the source-drain pattern 113 may be provided separately, that is, the source-drain pattern 104 and the source-drain pattern 113 do not contact with each other, the LTPS active layer pattern 101 and the LTPS active layer pattern 111 also may be provided separately, that is, the LTPS active layer pattern 101 and the LTPS active layer pattern 111 do not contact with each other. As a preferred solution, the source-drain pattern 103 may be a drain, and the source-drain pattern 104 may be a source. Alternative, the source-drain pattern 113 may be a source, and the source-drain pattern 114 may be a drain.

In the present embodiment, as the LTPS active layer pattern 101 comprises the n-type doped pattern 1012 and the n-type doped pattern 1013, and the LTPS active layer pattern 111 comprises the p-type doped pattern 1112 and the p-type doped pattern 1113, the LTPS thin film transistor 10 and the LTPS thin film transistor 11 constitute a complementary metal oxide semiconductor (CMOS), which has a low power consumption.

In actual applications, each of the LTPS active layer patterns of the LTPS thin film transistors in the periphery region may only comprise n-type doped pattern, or each of the LTPS active layer patterns of the LTPS thin film transistors in the periphery region may only comprise p-type doped pattern.

In actual applications, the LTPS structure may further comprise a metal line. The metal line may be formed on the LTPS active layer pattern of the LTPS thin film transistor, and the metal line may include a metal test line and/or a metal lead line, which will not be shown in the drawings.

The array substrate of the present embodiment comprises a base substrate, and a pixel region and a periphery region formed on the base substrate, wherein the periphery region is located around the pixel region, the pixel region comprises an a-Si thin film transistor, and the periphery region comprises a LTPS structure. As the a-Si thin film transistor is used in the pixel region, the problem that there is a too large leakage current in the pixel region of a LTPS array substrate in the prior art is overcome, the leakage current of the pixel region is reduced, while as the LTPS structure is used in the periphery region, a narrow frame of a display panel and a display apparatus may be achieved.

A second embodiment of the present invention provides a display panel comprising an array substrate, wherein the array substrate may be the array substrate according to the first embodiment of the present invention, which will not be repeatedly described here. The display panel may be a display panel of an advanced super dimension switch (ADS) apparatus.

A third embodiment of the present invention provides a display apparatus comprising above display panel. The display apparatus may be a monitor, a portable computer, a television, a telephone, and so on.

A fourth embodiment of the present invention provides a manufacturing method of an array substrate. The manufacturing method comprises steps of: forming a pixel region and a periphery region on a base substrate, wherein the periphery region is located around the pixel region, an a-Si thin film transistor is formed in the pixel region and a LTPS structure is formed in the periphery region.

In the present embodiment, the LTPS structure comprises a LTPS thin film transistor. A gate, an amorphous silicon active layer pattern, a source and a drain of the a-Si thin film transistor are formed in the pixel region, and a low temperature poly-silicon active layer pattern, a gate and a source-drain pattern of the LTPS thin film transistor are formed in the periphery region, wherein the amorphous silicon active layer pattern and the low temperature active layer pattern are formed in the same layer, that is, they are provided at roughly the same high level.

In the manufacturing method of the present embodiment, as the a-Si thin film transistor is formed in the pixel region, the problem that there is a too large leakage current in the pixel region of a LTPS array substrate in the prior art is overcome, the leakage current of the pixel region is reduced, while as the LTPS structure is formed in the periphery region, a narrow frame of a display panel and a display apparatus may be achieved.

The manufacturing method of the present invention will be described in detail with reference to the fourth embodiment. In the present embodiment, as an example, the a-Si thin film transistor is a bottom-gate-type a-Si thin film transistor and the LTPS thin film transistor is a top-gate-type LTPS thin film transistor.

Figure 2:
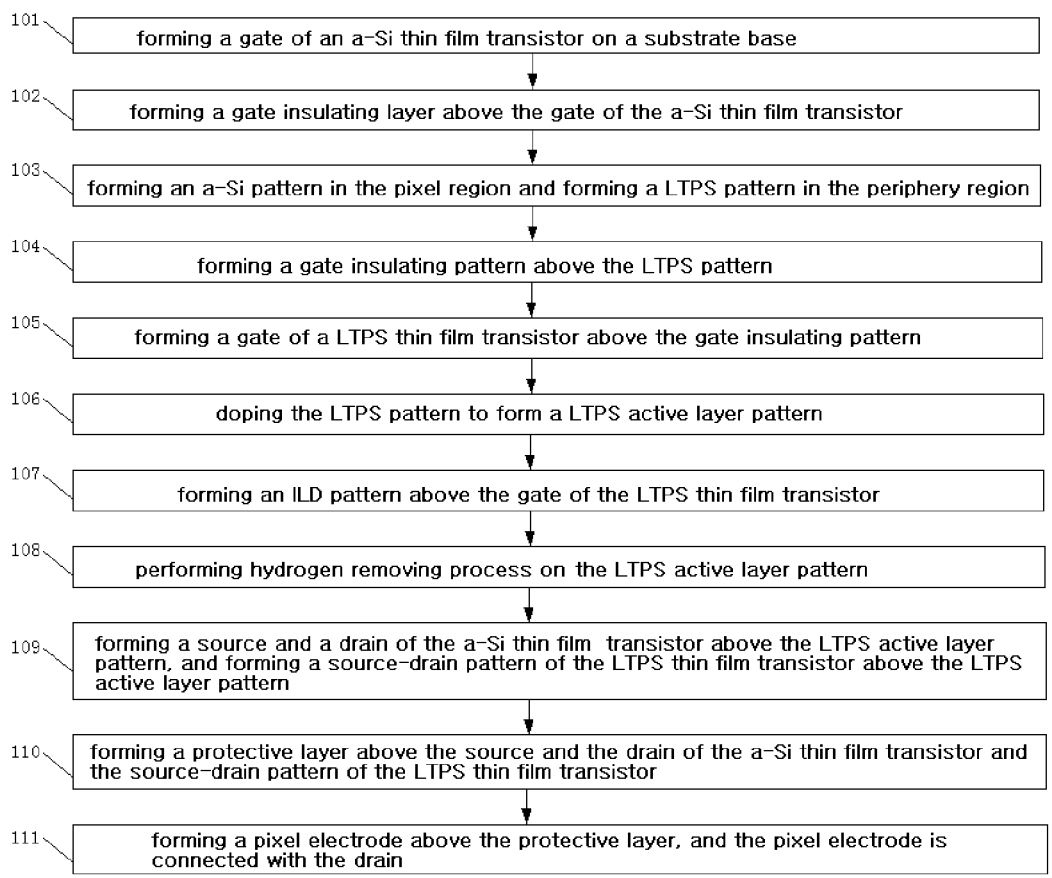
FIG. 2 shows a flowchart of a manufacturing method of an array substrate according to a fourth embodiment of the present invention.

FIG. 2 shows a flowchart of the manufacturing method of the array substrate according to the fourth embodiment of the present invention. As shown in FIG. 2, the manufacturing method comprises following steps 101 to 111.

Step 101, forming a gate of an a-Si thin film transistor on a base substrate.

Figure 3A:
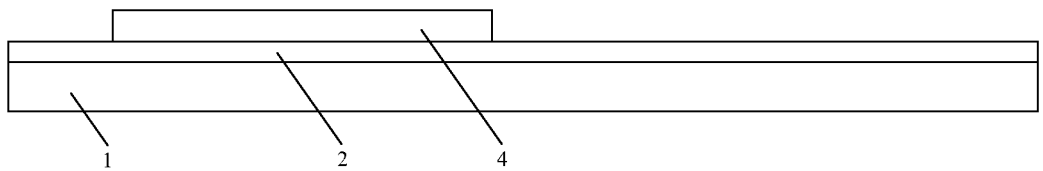
FIG. 3a shows a diagram of forming a gate of an a-Si thin film transistor in the fourth embodiment.

FIG. 3a shows a diagram of forming the gate of the a-Si thin film transistor in the fourth embodiment. As shown in FIG. 3a, a gate metal layer is formed on a base substrate 1, and a patterning process is performed on the gate metal layer to form a gate 4 on the base substrate 1. Before forming the gate 4, a buffer layer 2 may be formed on the base substrate 1, the buffer layer 2 is formed below the gate 4 and covers the whole base substrate 1.

Step 102, forming a gate insulating layer above the gate of the a-Si thin film transistor.

Figure 3B:
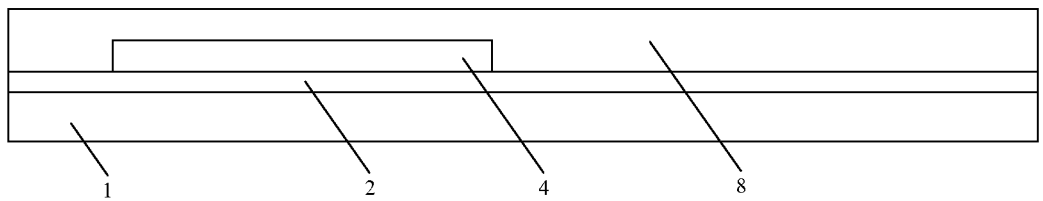
FIG. 3b shows a diagram of forming a gate insulating layer in the fourth embodiment.

FIG. 3b shows a diagram of forming the gate insulating layer in the fourth embodiment. As shown in FIG. 3b, a gate insulating layer 8 is formed above the gate 4, for example, by a chemical vapor deposition method, and the gate insulating layer 8 covers the whole base substrate 1.

Step 103, on the gate insulating layer 8, forming an a-Si active layer pattern in the pixel region and forming a LTPS pattern in the periphery region.

In the present embodiment, the step 103 comprises following sub-steps 1031 to 1034.

Sub-step 1031, forming an a-Si material layer on the gate insulating layer.

Figure 3C:
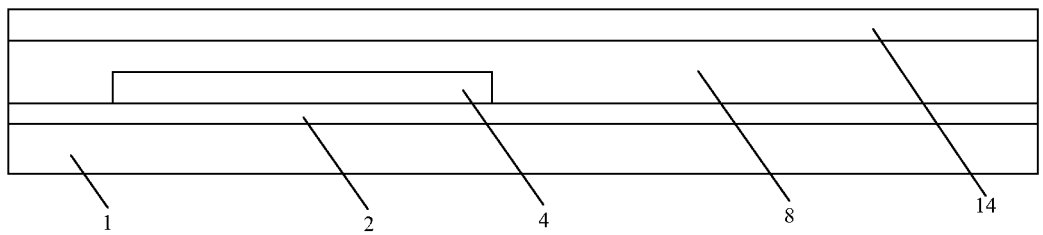
FIG. 3c shows a diagram of forming an a-Si material layer in the fourth embodiment.

FIG. 3c shows a diagram of forming the a-Si material layer in the fourth embodiment. As shown in FIG. 3c, an a-Si material layer 14 is formed on the gate insulating layer 8, for example, by a chemical vapor deposition method.

Sub-step 1032, shielding the pixel region by using a UV glass (i.e., an anti-UV glass substrate), and performing a laser crystallization process on the a-Si material layer in the periphery region to form a LTPS material layer in the periphery region.

Figure 3D:
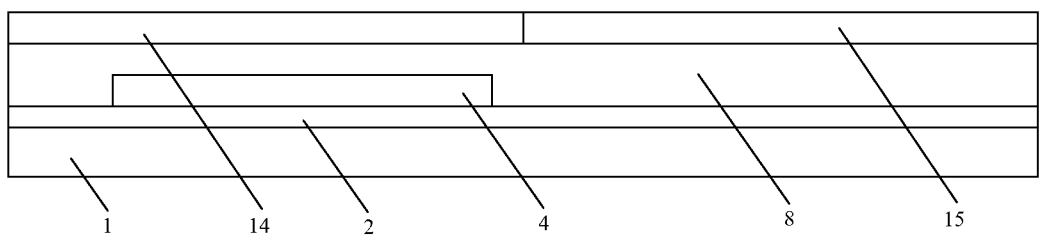
FIG. 3d shows a diagram of forming a LTPS material layer in the fourth embodiment.

FIG. 3d shows a diagram of forming the LTPS material layer in the fourth embodiment. As shown in FIG. 3d, the pixel region is shielded by a UV glass, and a laser crystallization process is performed on the a-Si material layer in the periphery region to form a LTPS material layer 15 in the periphery region.

Sub-step 1033, patterning the a-Si material layer in the pixel region and the LTPS material layer in the periphery region to form an a-Si pattern in the pixel region and a LTPS pattern in the periphery region.

Sub-step 1034, forming an N+ a-Si pattern on the a-Si pattern to form an a-Si active layer pattern in the pixel region.

Figure 3E:
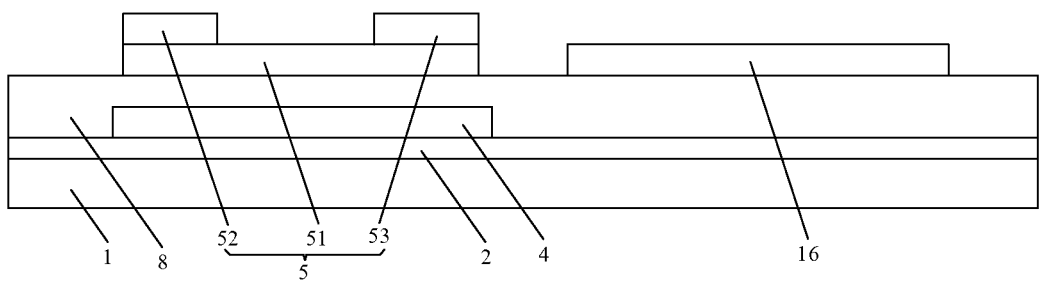
FIG. 3e shows a diagram of forming an a-Si active layer pattern and a LTPS pattern in the fourth embodiment.

FIG. 3e shows a diagram of forming the a-Si active layer pattern and the LTPS pattern in the fourth embodiment. As shown in FIG. 3e, an a-Si pattern 51 is formed in the pixel region by a patterning process and a LTPS pattern 6 is formed in the periphery region by a patterning process. An N+ a-Si material layer may be formed above the a-Si pattern 51, for example, by a chemical vapor deposition method, and a patterning process is performed on the N+ a-Si material layer to form an N+ a-Si pattern 52 and an N+ a-Si pattern 53 on the a-Si pattern 51, thereby an a-Si active layer pattern 5 comprising the a-Si pattern 51, the N+ a-Si pattern 52 and the N+ a-Si pattern 53 is formed.

Step 104, forming a gate insulating pattern above the LTPS pattern.

Figure 3F:
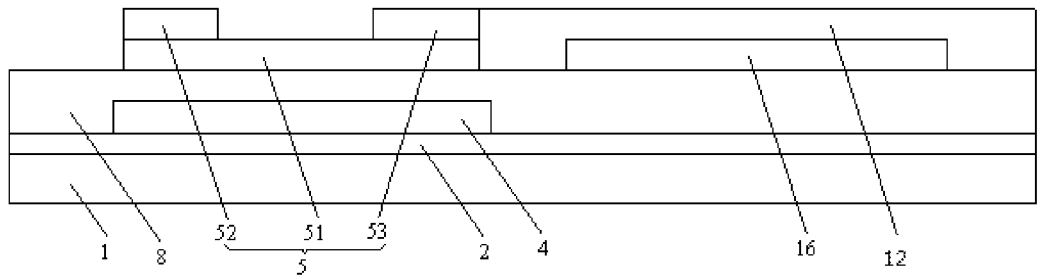
FIG. 3f shows a diagram of forming a gate insulating pattern in the fourth embodiment.

FIG. 3f shows a diagram of forming the gate insulating pattern in the fourth embodiment. As shown in FIG. 3f, a gate insulating layer is formed above the LTPS pattern 16, for example, by a chemical vapor deposition method, and a patterning process is performed on the gate insulating layer to form a gate insulating pattern 12 above the LTPS pattern 16. The gate insulating pattern 12 may be made of SiNx material.

Step 105, forming a gate of the LTPS thin film transistor on the gate insulating pattern.

Figure 3G:
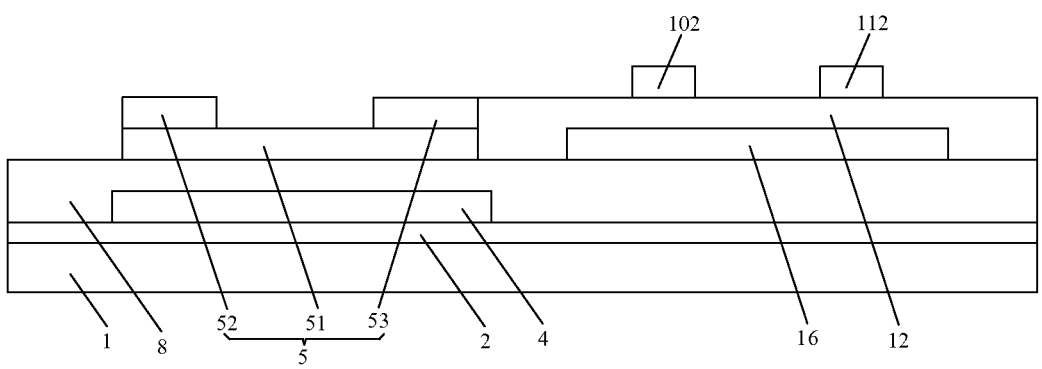
FIG. 3g shows a diagram of forming a gate of a LTPS thin film transistor in the fourth embodiment.

FIG. 3g shows a diagram of forming the gate of the LTPS thin film transistor in the fourth embodiment. As shown in FIG. 3g, a gate metal layer is formed on the gate insulating pattern 12, for example, by a physical vapor deposition method, and a patterning process is performed on the gate metal layer to form a gate 102 and a gate 112 on the gate insulating pattern 12.

Step 106, doping the LTPS pattern to form a LTPS active layer pattern.

In the present embodiment, the step 106 comprises following sub-steps 1061 to 1063.

Figure 3H:
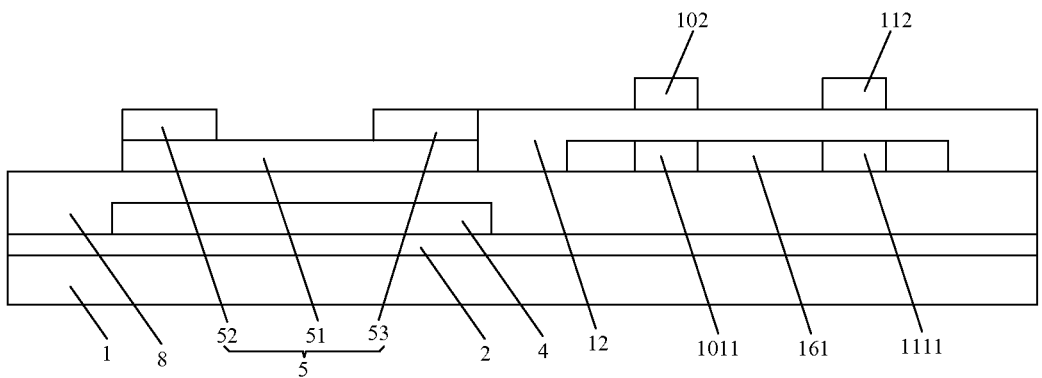
FIG. 3h shows a diagram of forming a LDD pattern in the fourth embodiment.

Sub-step 1061, doping the LTPS pattern 16 to form a lightly doped drain region (LDD), so as to form a LDD pattern 161, a LTPS sub-pattern 1011 below the gate 102, and a LTPS sub-pattern 1111 below the gate 112, as shown in FIG. 3h. FIG. 3h shows a diagram of forming the LDD pattern in the fourth embodiment.

Specifically, a photoresist layer is applied to the pixel region and the periphery region, a patterning process is performed thereon to form a photoresist pattern covering the pixel region so as to protect structures in the pixel region. Then, the LTPS pattern 16 is doped to form a LDD, and the photoresist pattern is removed.

Figure 3I:
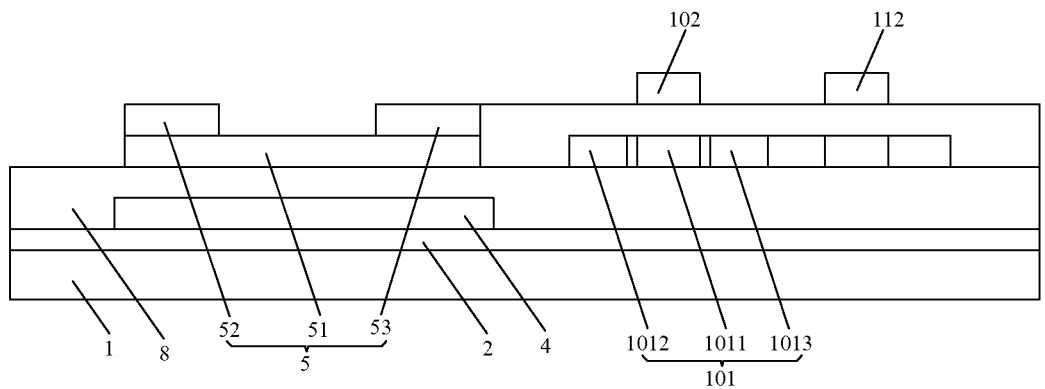
FIG. 3i shows a diagram of forming an n-type doped pattern in the fourth embodiment.

Sub-step 1062, doping the LDD pattern 161 with n-type dopant to form an n-type doped pattern 1012 and an n-type doped pattern 1013, as shown in FIG. 3i. FIG. 3i shows a diagram of forming the n-type doped pattern in the fourth embodiment.

Specifically, a photoresist layer is applied to the pixel region and the periphery region, and a patterning process is performed to form a photoresist pattern covering the region not to be doped, so as to protect structures in the region not to be doped. Then, the LDD pattern 161 is doped with n-type dopant, and the photoresist pattern is removed.

Figure 3J:
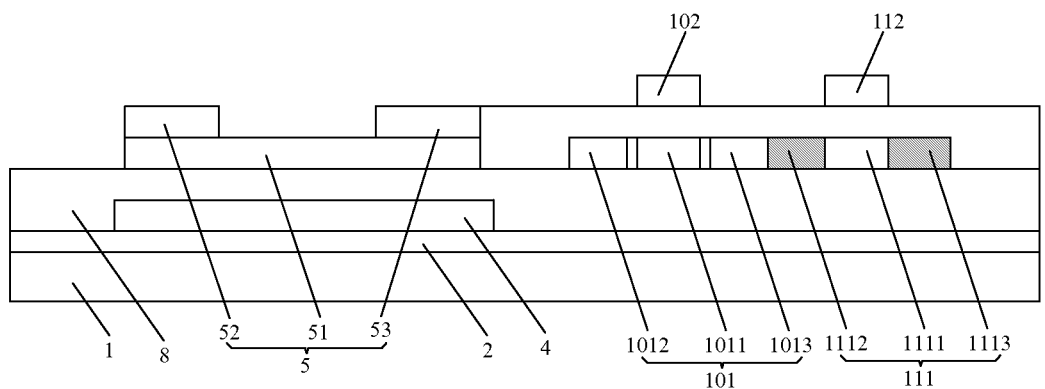
FIG. 3j shows a diagram of forming a p-type doped pattern in the fourth embodiment.

Sub-step 1063, doping the LDD pattern 161 with p-type dopant to form a p-type doped pattern 1112 and a p-type doped pattern 1113, as shown in FIG. 3j. FIG. 3j shows a diagram of forming the p-type doped pattern in the fourth embodiment.

Specifically, a photoresist layer is applied to the pixel region and the periphery region, and a patterning process is performed to form a photoresist pattern covering the region not to be doped, so as to protect structures in the region not to be doped. Then, the LDD pattern 161 is doped with p-type dopant, and the photoresist pattern is removed.

As above, the LTPS active layer pattern 101 formed by the step 106 comprises the LTPS sub-pattern 1011, and the n-type doped pattern 1012 and the n-type doped pattern 1013 formed at two sides of the LTPS sub-pattern 1011 respectively. The formed LTPS active layer pattern 111 comprises the LTPS sub-pattern 1111, and the p-type doped pattern 1112 and the p-type doped pattern 1113 formed at two sides of the LTPS sub-pattern 1111.

Step 107, forming an ILD pattern above the gate of the LTPS thin film transistor.

Figure 3K:
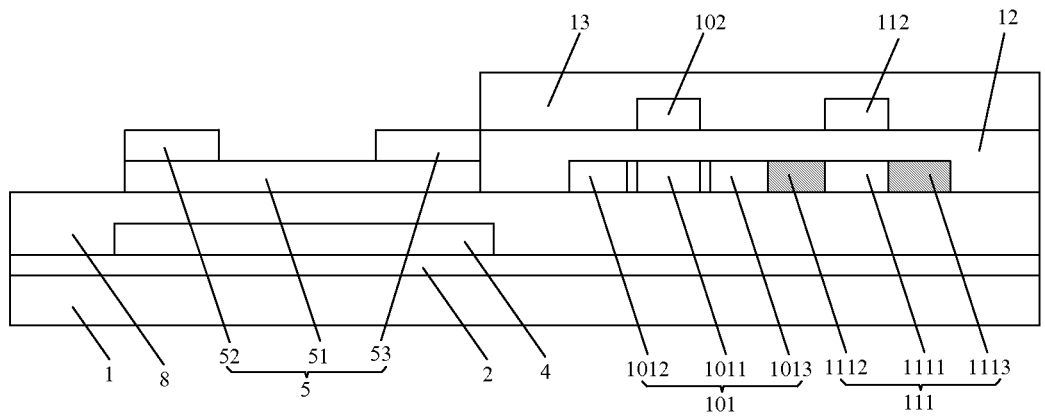
FIG. 3k shows a diagram of forming an ILD pattern in the fourth embodiment.

FIG. 3k shows a diagram of forming the ILD pattern in the fourth embodiment. As shown in FIG. 3k, an ILD material layer is deposited above the gate 102 and the gate 112, and a patterning process is performed on the ILD material layer to form an ILD pattern 13.

Step 108, performing a hydrogen removing process on the LTPS active layer pattern.

Step 109, forming a source and a drain of the a-Si thin film transistor on the a-Si active layer pattern, and forming a source-drain pattern of the LTPS thin film transistor on the LTPS active layer pattern.

Figure 3L:
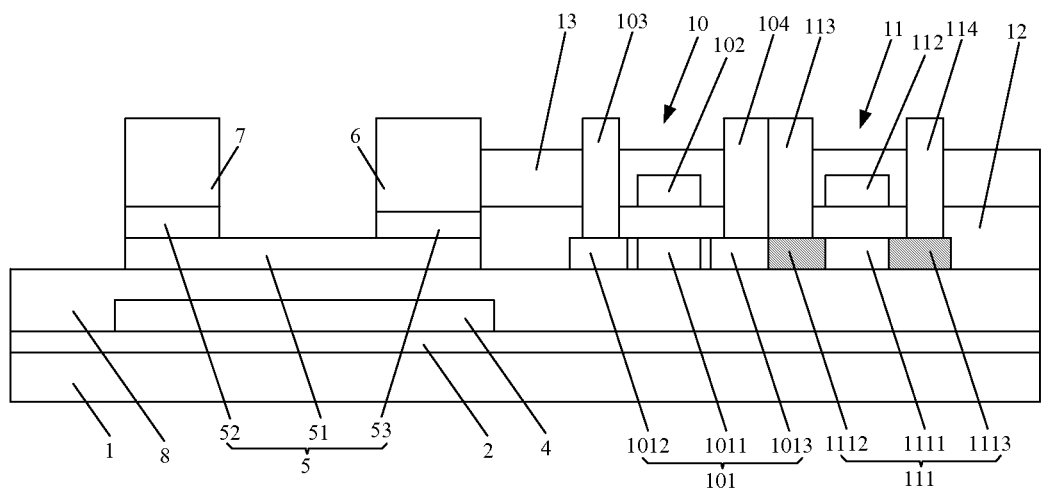
FIG. 3l shows a diagram of forming a source and a drain of the a-Si thin film transistor and forming a source-drain pattern of the LTPS thin film transistor in the fourth embodiment.

FIG. 3*l* shows a diagram of forming the source and the drain of the a-Si thin film transistor and forming the source-drain pattern of the LTPS thin film transistor in the fourth embodiment. As shown in FIG. 3*l*, the step 109 specifically comprises: forming a source-drain metal layer on the ILD pattern, and patterning the source-drain metal layer to form a source 6 and a drain 7 of the a-Si thin film transistor, and form a source-drain pattern 103, a source-drain pattern 104, a source-drain pattern 113 and a source-drain pattern 114 of the LTPS thin film transistor. Further, before the step 109, a plurality of through-holes are formed in the ILD pattern, so that the source-drain pattern 103 is filled in a through-hole to achieve the connection of the source-drain pattern 103 and the n-type doped pattern 1012, the source-drain pattern 104 is filled in a through-hole to achieve the connection of the source-drain pattern 104 and the n-type doped pattern 1013, the source-drain pattern 113 is filled in a through-hole to achieve the connection of the source-drain pattern 113 and the p-type doped pattern 1112, and the source-drain pattern 114 is filled in a through-hole to achieve the connection of the source-drain pattern 114 and the p-type doped pattern 1113.

Step 110, forming a passivation layer (PVX) above the source and the drain of the a-Si thin film transistor and the source-drain pattern of the LTPS thin film transistor.

Figure 3M:
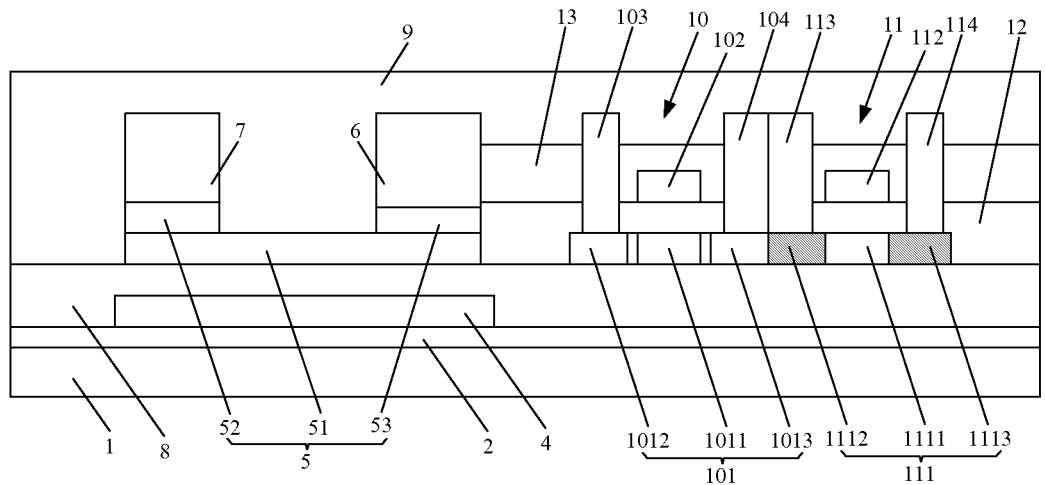
FIG. 3m shows a diagram of forming a passivation layer in the fourth embodiment.

FIG. 3*m* shows a diagram of forming the passivation layer in the fourth embodiment. As shown in FIG. 3*m*, a passivation layer 9 is formed above the source 6 and the drain 7 of the a-Si thin film transistor, and the source-drain pattern 103, the source-drain pattern 104, the source-drain pattern 113 and the source-drain pattern 114 of the LTPS thin film transistor, and the passivation layer 9 covers the whole array substrate.

Step 111, in the pixel region, forming a pixel electrode on the passivation layer, and the pixel electrode is connected with the drain of the pixel region.

As shown in FIG. 1, the step 111 specifically may comprise: forming a through-hole in the passivation layer 9, and the through-hole is formed above the drain 7 of the a-Si thin film transistor; then, forming a pixel electrode material layer on the passivation layer 9; patterning the pixel electrode material layer to form a pixel electrode 3, so that the pixel electrode 3 is filled in the through-hole to achieve the connection of the pixel electrode 3 and the drain 7.

In the present invention, the patterning process may comprise: applying the photoresist, exposure, developing, etching, stripping off the photoresist and so on.

It should be noted that, the sequence of the steps in the present embodiment may be changed in accordance with actual requirements.

The manufacturing method of an array substrate in the present embodiment comprises steps of: forming a pixel region and a periphery region on a base substrate, wherein the periphery region is located around the pixel region, an a-Si thin film transistor is formed in the pixel region, and a LTPS structure is formed in the periphery region. As the a-Si thin film transistor is used in the pixel region, the problem that there is a too large leakage current in the pixel region of the LTPS array substrate in the prior art is overcome, the leakage current in the pixel region is reduced, while as the LTPS structure is used in the periphery region, a narrow frame of the display panel and the display apparatus may be achieved.

It should be understood that, the above implementations are only used to explain the principle of the present invention, but not to limit the present invention. Some technical features of the above may be omitted from the embodiments of the present invention so as to only solve a part of the technical problems existing in the prior art, and the disclosed technical features may be combined in an arbitrary way. The person skilled in the art can make various variations and modifications without departing from the spirit and scope of the present invention, and the variations and modifications fall into the scope of the present invention. The protection scope of the present invention should be defined by the claims.

The invention claimed is:

1. An array substrate comprising:
   a base substrate; and
   a pixel region and a periphery region formed on the base substrate, wherein the periphery region is located around the pixel region, the pixel region comprises an amorphous silicon thin film transistor, the periphery region comprises a low temperature poly-silicon structure, and the low temperature poly-silicon structure in the periphery region includes a p-type thin film transistor and an n-type thin film transistor connected with each other, wherein a p-type doped pattern of the p-type thin film transistor is directly in contact with an n-type doped pattern of the n-type thin film transistor, and a gate of the p-type thin film transistor and a gate of the n-type thin film transistor are independent of each other.

2. The array substrate of claim 1, wherein the amorphous silicon thin film transistor is a bottom-gate-type amorphous silicon thin film transistor.

3. The array substrate of claim 1, wherein the low temperature poly-silicon structure comprises a low temperature poly-silicon thin film transistor.

4. The array substrate of claim 3, wherein the low temperature poly-silicon thin film transistor is a top-gate-type low temperature poly-silicon thin film transistor.

5. The array substrate of claim 3, wherein the amorphous silicon thin film transistor comprises an amorphous silicon active layer pattern, the low temperature poly-silicon thin film transistor comprises a low temperature poly-silicon active layer pattern, and the amorphous silicon active layer pattern and the low temperature poly-silicon active layer pattern are formed in the same layer.

6. The array substrate of claim 1, further comprises:
   a buffer layer, which is formed on the base substrate and below the amorphous silicon thin film transistor and the low temperature poly-silicon structure, and covers the whole base substrate.

7. A display panel comprising an array substrate, wherein the array substrate comprising:
   a base substrate; and
   a pixel region and a periphery region formed on the base substrate, wherein the periphery region is located around the pixel region, the pixel region comprises an amorphous silicon thin film transistor, the periphery region comprises a low temperature poly-silicon structure, and the low temperature poly-silicon structure in the periphery region includes a p-type thin film transistor and an n-type thin film transistor connected with each other, wherein a p-type doped pattern of the p-type thin film transistor is directly in contact with an n-type doped pattern of the n-type thin film transistor, and a gate of the p-type thin film transistor and a gate of the n-type thin film transistor are independent of each other.

8. The display panel of claim 7, wherein the amorphous silicon thin film transistor is a bottom-gate-type amorphous silicon thin film transistor.

9. The display panel of claim 7, wherein the low temperature poly-silicon structure comprises a low temperature poly-silicon thin film transistor.

10. The display panel of claim 9, wherein the low temperature poly-silicon thin film transistor is a top-gate-type low temperature poly-silicon thin film transistor.

11. The display panel of claim 9, wherein the amorphous silicon thin film transistor comprises an amorphous silicon active layer pattern, the low temperature poly-silicon thin film transistor comprises a low temperature poly-silicon active layer pattern, and the amorphous silicon active layer pattern and the low temperature poly-silicon active layer pattern are formed in the same layer.

12. The display panel of claim 7, further comprises:
 a buffer layer, which is formed on the base substrate and below the amorphous silicon thin film transistor and the low temperature poly-silicon structure, and covers the whole base substrate.

\* \* \* \* \*